United States Patent [19]

Takagi et al.

[11] Patent Number: 5,236,869
[45] Date of Patent: Aug. 17, 1993

[54] METHOD OF PRODUCING SEMICONDUCTOR DEVICE

[75] Inventors: Hideo Takagi; Akihiro Yoshida, both of Kawasaki, Japan

[73] Assignee: Fujitsu Limited, Kawasaki, Japan

[21] Appl. No.: 833,003

[22] Filed: Feb. 10, 1992

[30] Foreign Application Priority Data

Feb. 14, 1991 [JP] Japan .................... 3-20605

[51] Int. Cl.$^5$ .................. H01L 21/441; H01L 21/465
[52] U.S. Cl. .................... 437/190; 437/192; 437/200; 437/245; 427/126.3; 148/DIG. 147
[58] Field of Search ............. 437/245, 190, 192, 200; 427/126.3; 148/DIG. 147

[56] References Cited

U.S. PATENT DOCUMENTS

| | | | |
|---|---|---|---|
| 4,200,474 | 4/1980 | Morris | 437/245 X |
| 4,307,132 | 12/1981 | Chu et al. | |
| 4,742,025 | 5/1988 | Ohyu et al. | 437/245 X |
| 4,839,010 | 6/1989 | Cleavelin et al. | 437/245 X |
| 5,122,477 | 6/1992 | Wolters et al. | 437/192 X |

FOREIGN PATENT DOCUMENTS

| | | | |
|---|---|---|---|
| 0048647 | 3/1984 | Japan | 437/245 |
| 62-113421 | 5/1987 | Japan . | |

OTHER PUBLICATIONS

*Patent Abstracts of Japan*, vol. 11, No. 325 (E-551), Oct. 22, 1987 (JP 62-113421-May 25, 1987).
*Patent Abstracts of Japan*, vol. 14, No. 200 (E-920), Apr. 24, 1990 (JP 2-043726-Feb. 14, 1990).
*Patent Abstracts of Japan*, vol. 16, No. 79 (E-1171), Feb. 26, 1992 (JP 3-268425-Nov. 29, 1991).
*IBM Techanical Disclosure Bulletin*, "Use of conducting oxides as a diffusion barrier in shallow junction semiconductor devices", vol. 30, No. 8, pp. 436-437, Jan. 1988, NY, US.

*Primary Examiner*—John S. Maples
*Attorney, Agent, or Firm*—Staas & Halsey

[57] ABSTRACT

The surface of a barrier layer interposed between a silicon substrate and aluminum wiring connected thereto is oxidized by heat treatment at 350° to 450° C. in an atmosphere having substantially the same composition as that of air or immersion in an oxidizing chemical to form an oxide film on the surface, and a wiring layer is then formed thereon. The presence of the oxide film inhibits interdiffusion between the silicon substrate and the aluminum wiring and reaction between the aluminum wiring and the barrier layer. Since this oxide film is formed by oxidation at the atmospheric pressure, the oxide film is not excessively oxidized even if it is exposed in air at a relatively high temperature of about 300° C. The oxide film having a thickness and properties which produce the tunnel effect can be formed with good reproducibility.

7 Claims, 4 Drawing Sheets

METHOD OF PRODUCING SEMICONDUCTOR DEVICE

BACKGROUND OF THE INVENTION

1. Field of the Invention

The present invention relates to a semiconductor device comprising a barrier layer made of a high-melting point metal and provided between aluminum or aluminum alloy wiring and a silicon substrate.

2. Description of the Related Art

Thin films made of aluminum or aluminum-silicon or aluminum-copper alloys are mainly used as internal wiring materials for semiconductor devices. However, when Al or an Al alloy is put into direct contact with a silicon substrate, interdiffusion between the wiring and the substrate is produced by heating in various subsequent steps, producing a problem with respect to the reliability of the connection between the wiring and the substrate. Particularly, a high-density semiconductor device comprising a thin impurity diffusion layer formed on a silicon substrate produces the critical problem that the thin impurity diffusion layer is damaged by such interdiffusion.

A method is therefore employed in which a nitride film of a high-melting point metal such as titanium nitride (TiN) or the like is interposed as a barrier layer between aluminum or aluminum alloy wiring and a silicon substrate in order to inhibit interdiffusion between aluminum and the silicon substrate. However, the interdiffusion between aluminum and the silicon substrate cannot be completely inhibited by such a barrier layer comprising a TiN thin film. It is thought that this is because Al atoms diffuse through the grain boundaries of microcrystals which constitute the TiN thin film. In addition, the TiN thin film is sometimes made ineffective as a barrier layer due to a decrease in the effective thickness thereof, which is caused by reaction between aluminum and the TiN thin film.

In order to solve the problems, a method is proposed in Japanese Patent Laid-Open No. 62-113421 in which a high-melting point metal film and a high-melting point metal nitride film are formed on a silicon substrate, and the surface of the metal nitride film is then thinly oxidized by heat treatment in an atmosphere of oxygen at 1 to $3 \times 10^{-3}$ Torr. Namely, a thin oxide film is formed on the surface of the metal nitride film by heat treatment so that reaction of aluminum wiring with the high-melting point metal nitride film and the silicon substrate is inhibited.

However, the above method requires an apparatus for heat treatment in an atmosphere of oxygen at low pressure. In addition, since a long time is required for cooling the substrate in the heat treatment apparatus to a temperature at which the metal nitride film having the thin oxide film formed thereof is not further oxidized in air, a mechanism for promoting cooling must be provided. This inevitably brings about the sacrifice of the throughput of the heat treatment step or an increase in the equipment cost.

SUMMARY OF THE INVENTION

It is an object of the present invention to provide a method which enables heat treatment for forming an oxide film on the surface of a barrier layer comprising a high-melting point metal nitride film to be performed without requiring a specified heat treatment apparatus and decreasing the throughput.

In order to achieve the object, the surface of a barrier layer formed on a silicon substrate and comprising, for example, a TiN film is oxidized by heating in a furnace atmosphere having substantially the same composition as that of air (i.e., having an oxygen concentration of $20 \pm 5\%$ and a nitrogen concentration of $80 \pm 5\%$), or immersing in an oxidizing chemical such as nitric acid to form an oxide film having a thickness of about 20 to 50 Å thereon. A wiring layer made of aluminum, an aluminum alloy, tungsten, gold or copper is deposed on the barrier layer having the oxide film formed thereon. As a result, not only interdiffusion between the wiring layer and the substrate but also reaction between the aluminum wiring layer and the barrier layer are inhibited. It is thought that the oxide film comprises a TiN film containing titanium oxides such as TiO, $TiO_2$ and the like. Even if such an oxide film is an insulator, when the oxide film has a thickness of 20 to 50 Å or less, conductivity between the silicon substrate and the wiring layer is maintained due to the tunnel effect without any practical problem.

The present invention requires no apparatus for heat treatment in a low-pressure oxygen atmosphere. In addition, since the surface of the high-melting point metal film is mainly oxidized by heat treatment in an atmosphere having substantially the same composition as that of air or immersing in a chemical, the substance treated is hardly further oxidized even if it is exposed to air. There is thus no need for a specific mechanism for cooling the substance treated, and a surface oxide film having a predetermined thickness and properties can be stably formed.

DESCRIPTION OF THE PREFERRED EMBODIMENTS

Figure 1:
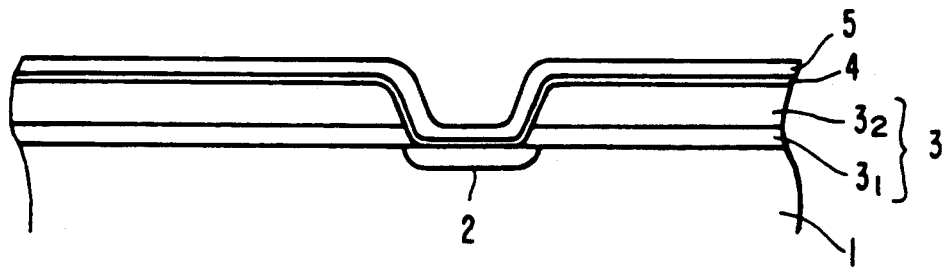
FIGS. 1 to 4 are sectional views explaining the steps of a production method in accordance with an embodiment of the present invention.

The steps of a method according to an embodiment of the present invention are described below with reference to the drawings. As shown in FIG. 1, an insulating layer 3 comprising an $SiO_2$ layer $3_1$ having a thickness of about 0.2 μm and a BPSG (boron-phosphosilicate glass) layer $3_2$ having a thickness of about 0.5 μm is deposited, by a known CVD (chemical vapor deposition) process, on the surface of a p-type silicon substrate 1 on which, for example, an n-type impurity diffusion layer 2 is formed. The insulating layer 3 is provided with an opening for exposing the impurity diffusion layer 2 to air, and a titanium film 4 having a thickness of about 300 Å and a TiN film 5 having a thickness of about 1000 Å are then successively deposited on the surface of the silicon substrate 1. The titanium film 4 may be formed by a known sputtering process using argon gas, and the TiN film 5 may be formed by a known reactive sputtering process using argon gas containing nitrogen.

Figure 5:
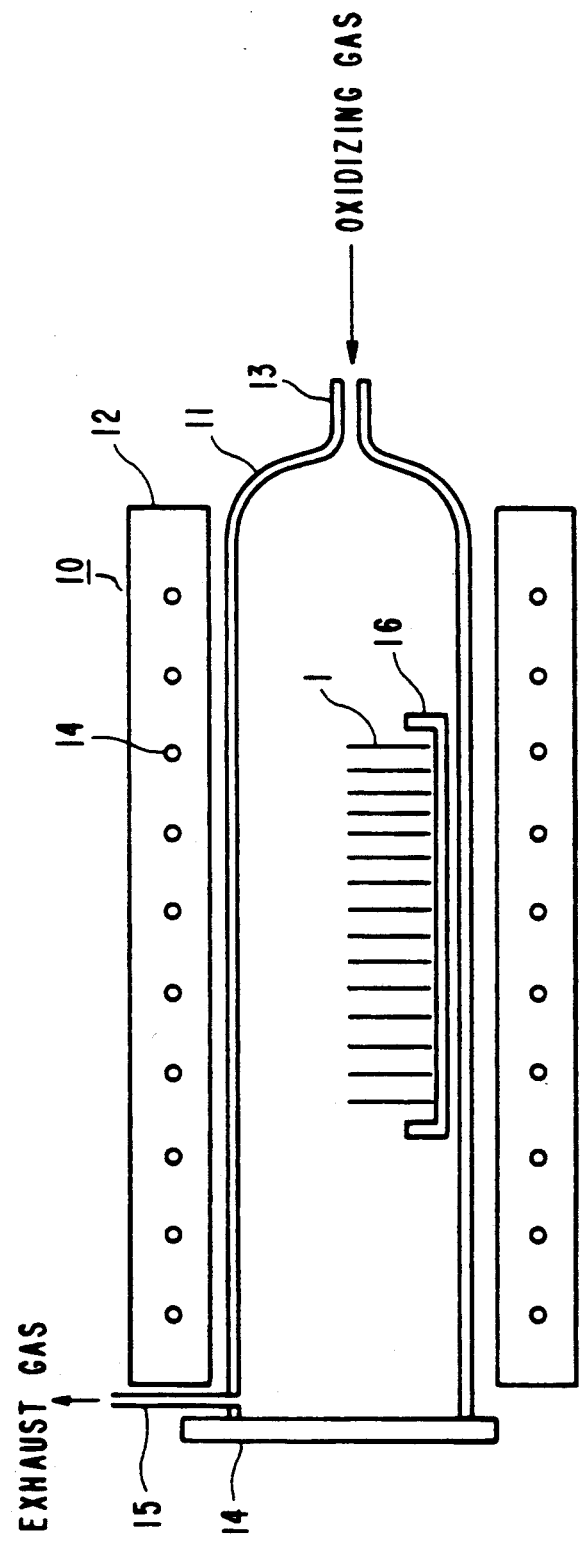
FIG. 5 is a sectional view showing an example of the structure of the heat treatment furnace used in the present invention.

The silicon substrate 1 is then treated using, for example, the horizontal heat treatment apparatus 10 shown in FIG. 5. The heat treatment apparatus 10 comprises a core tube 11, for example, made of quartz, and an electric furnace 12. A gas inlet tube 13 is connected to one end of the core tube 11, and the other end thereof is closed by a detachable cap 14 for discharging the substance treated. A gas exhaust tube 15 is also provided near the other end of the core tube 11. The electric furnace 12 is provided with, for example, a resistance heater 14. Atmospheric oxygen and nitrogen are supplied to the inside of the core tube 11 at flow rates of 6 sccm and 24 sccm, respectively, from the gas inlet tube 13. The current of the resistance heater 14 is controlled so that the temperature at the central portion of the core tube 11 is a predetermined temperature, e.g., 400° C. The gases introduced into the core tube 11 are spontaneously exhausted from the gas exhaust tube 15.

Figure 2:
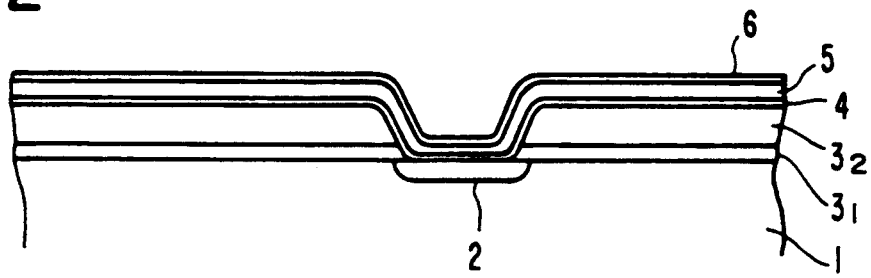

For example, the silicon substrate 1 held by a quartz carrier 16 is inserted into the core tube 11 and then heated for a predetermined time, for example 30 minutes. As a result, the surface of the TiN film 5 is oxidized to form an oxide film 6 having a thickness of about 30 Å, as shown in FIG. 2.

Figure 3:
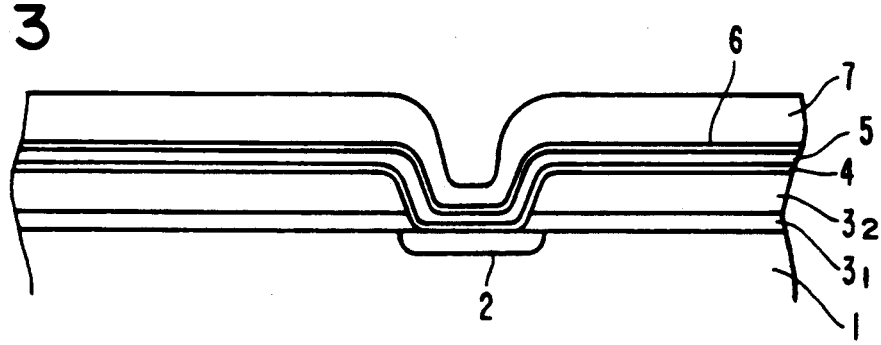
Figure 4:
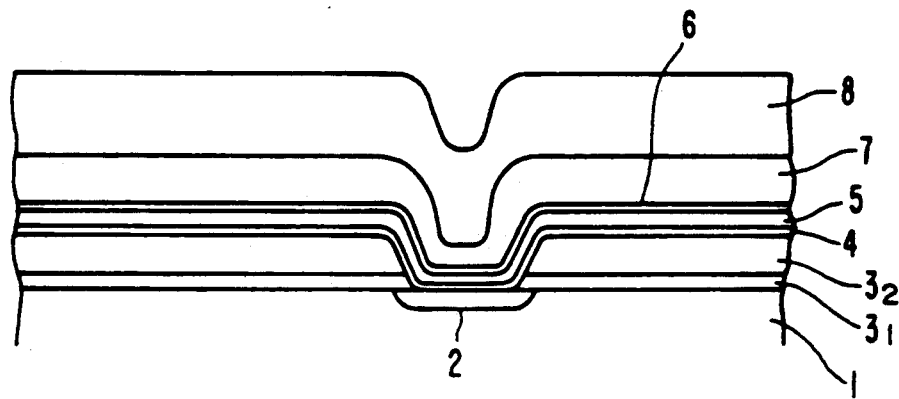

An aluminum film 7 containing 2% copper and having a thickness of about 0.5 μm is then deposited on the silicon substrate 1 by a known sputtering process, as shown in FIG. 3. After a wiring pattern is formed on the aluminum film 7 by known lithography, a BPSG cover film 8 is deposited on the silicon substrate 1, as shown in FIG. 4. The silicon substrate 1 is then annealed at 450° C. for 30 minutes in a gas mixture, for example, containing nitrogen and hydrogen.

The cover film 8 is generally deposited by the CVD process at a temperature of about 425° C. During the deposition of the cover film 8 and the subsequent heat treatment such as annealing or the like, interdiffusion between the aluminum film 7 and the silicon substrate 1 and reaction between the aluminum film 7 and the TiN film 5 are inhibited by the oxide film 6. It is thus possible to certainly remove the phenomenon that the PN junction between the impurity diffusion layer 2 and the silicon substrate 1 is destroyed by so-called aluminum spike. The reliability of connection between the wiring formed by the aluminum film 7 and the silicon substrate 1 can thus be guaranteed. The present invention also prevents an increase in resistance or breakage of the aluminum wiring which is caused by electromigration and thus improves the MTF (mean time to failure) characteristics. A conceivable cause for this is that since the reaction between the aluminum film 7 and the TiN film 5 is inhibited during the heat treatment, the crystal grains in the aluminum film 7 are easily grown, and electromigration is thus inhibited.

As described above, in the present invention, even if the silicon substrate 1 which is cooled to a temperature below 300° C. is discharged from the heat treatment apparatus 10 and exposed to air, further oxidation of the TiN film 5 hardly occurs because the surface of the TiN film 5 has been oxidized at a higher temperature in an atmosphere having substantially the same composition as that of air. The present invention thus enables the thickness and properties of the oxide film 6 to be controlled with good reproducibility. The present invention also enables the cooling time required until the silicon substrate 1 is discharged to air, i.e., the time taken for cooling the temperature of the heat treatment apparatus from the oxidation temperature of 400° C. to, for example, 300° C. or less, to be decreased to about 20 minutes or less. The present invention thus has no cause for substantially decreasing the throughput of the treatment process.

Figure 6:
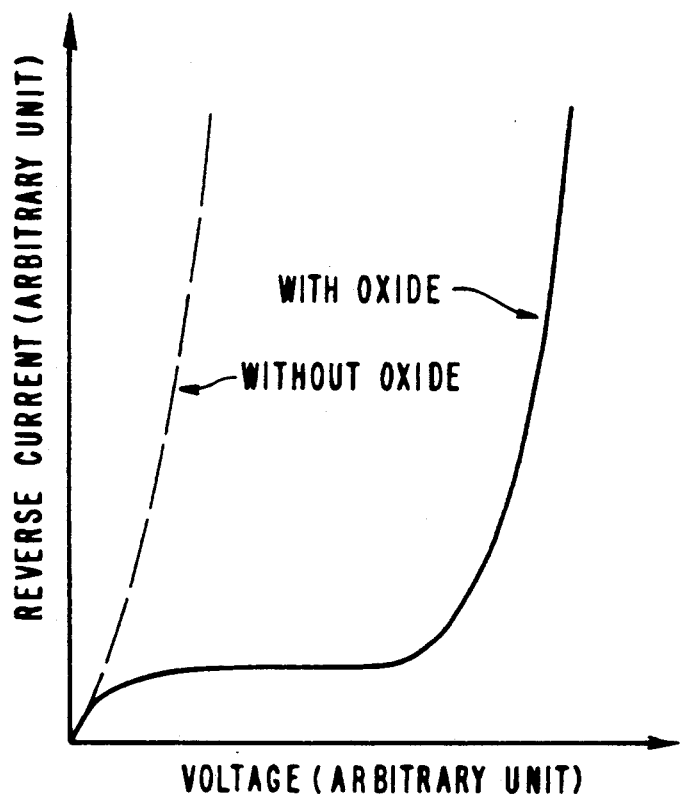
FIG. 6 is a graph showing the effects of the barrier layer treated in accordance with the present invention.

FIG. 6 is a graph showing the reverse current voltage characteristics of a PN junction which was connected to the aluminum wiring formed by the process shown in FIGS. 1 to 4. In the drawing, the characteristics of the case where the TiN film 5 was not subjected to the above-described oxidation are shown by a broken line. The case where oxidation was effected in accordance with the present invention shows normal reverse characteristics of voltage resistance. However, the case without oxidation produces junction leak showing substantially ohmic current-voltage characteristics. This fact indicates that reaction between the aluminum film 7 and the silicon substrate 1 or the TiN film 5 cannot be inhibited by the natural oxide film which is estimated to be present on the surface of the TiN film 5.

Figure 7:
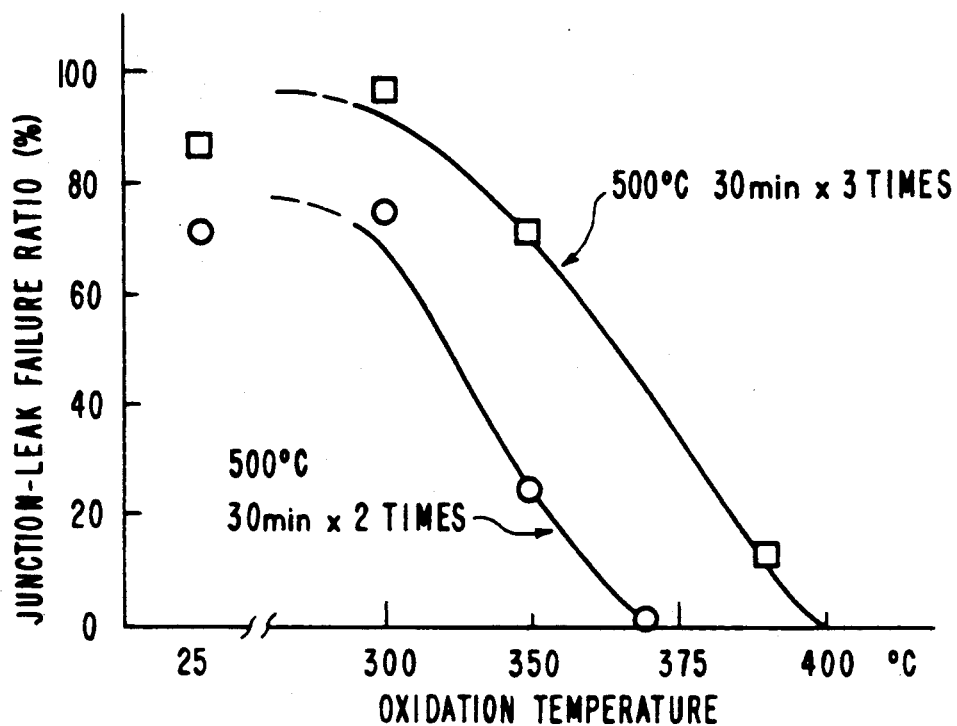
FIG. 7 is a graph showing a decrease in junction leak failure in the present invention.

FIG. 7 is a graph showing a relation between the oxidation temperature and the junction leak failure ratio when a TiN barrier layer was oxidized in an atmosphere containing 20% oxygen and 80% nitrogen. The parameter shows a difference in conditions of heat treatment performed after aluminum wiring was formed, i.e., a difference between the case where heat treatment at 500° C. for 30 minutes was performed twice and the case where this heat treatment was performed three times. As shown in the drawing, the junction leak failure ratio starts to decrease at an oxidation temperature of 300° C. and reaches substantially zero at a temperature of 400° C., as compared with the case without oxidation. It is a matter of course that the failure ratio increases as conditions of after heat treatment become severer. The conditions of after heat treatment of course depend upon the type of the semiconductor device produced.

Figure 8:
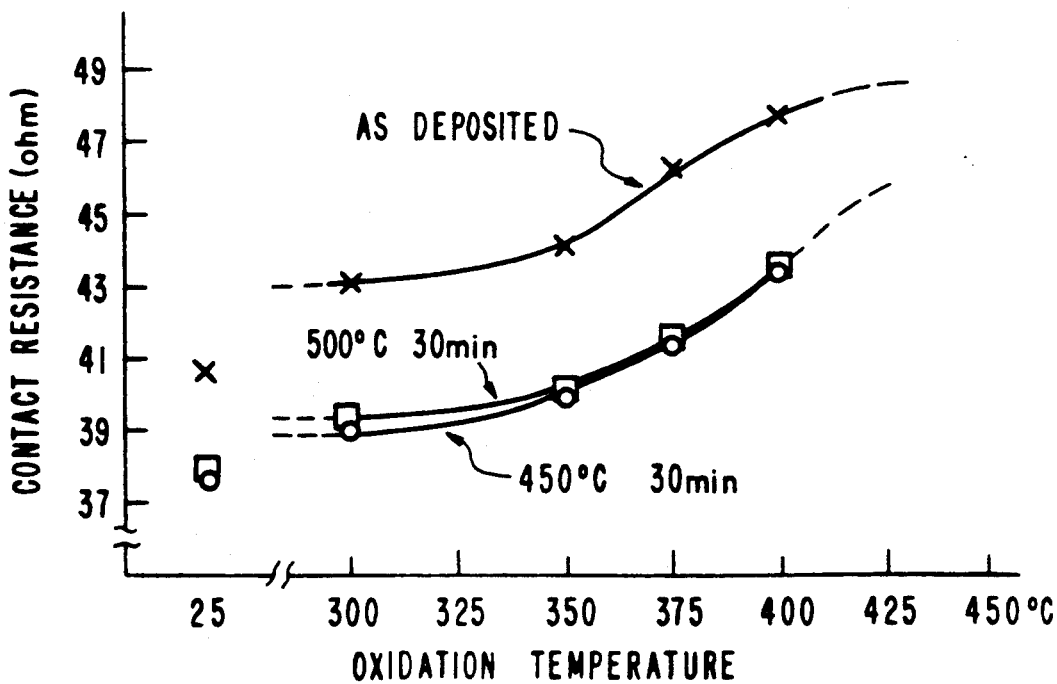
FIG. 8 is a graph showing a relation between the heat treatment temperature of a barrier layer and contact resistance in the present invention.

FIG. 8 is a graph showing a relation between the oxidation temperature and the contact resistance of aluminum wiring when a TiN barrier layer was oxidized in an atmosphere containing 20% oxygen and 80% nitrogen. The parameter shows a difference in conditions of heat treatment after the aluminum wiring was formed, i.e., a difference between the case where no heat treatment was performed after oxidation and the case where after heat treatment was performed in an atmosphere of nitrogen at 450° C. and 500° C. The time of the after heat treatment is 30 minutes in all the cases. As shown in the drawing, the contact resistance increases as the oxidation temperature increases. Although the contact resistance is increased by oxidation at 400° C. by about 20%, as compared with that of the case without oxidation, such a increase in contact resistance is not critical to usual semiconductor devices. Such an increase in contact resistance shows that the formation of an oxide film on the surface of the TiN film is promoted as the oxidation temperature increases. It is thought from the phenomenon that the contact resistance is decreased by after heat treatment and the fact shown in FIG. 7, that the oxide film formed on the surface of the TiN film is reduced by the aluminum wiring when the conditions of after heat treatment become severer. However, the fact shown in FIG. 7 that the junction-leak failure ratio is low even if afterheat treatment is performed 2 to 3 times at 500° C. for 30 minutes indicates that the oxide film still has the effect on the interdiffusion between the aluminum wiring and the silicon substrate even if after heat treatment is used.

In the present invention, it is thus suitable that the temperature of oxidation for forming the oxide film 6 is selected from the range from 350° C. to 450° C. Since oxidation at a temperature above 450° C. further increases the contact resistance of the aluminum film 7 with the silicon substrate 1 and causes the aluminum wiring 7 to be easily deteriorated by electromigration, such a temperature is undesirable. An oxidation time of 15 to 60 minutes has great difference in effect within the above temperature range. However, the oxidation time of 60 minutes or more is undesirable because the contact resistance is further increased. In regard to the atmosphere of heat treatment, if the flow rate ratio is controlled so that the oxygen concentration is 20±5%, and the nitrogen concentration is 80±5%, there is no difference in effect. It is estimated that the oxide film formed on the surface of the TiN barrier layer by heat treatment under conditions within the above optimum ranges has a thickness of 20 to 50 Å which allows conductivity to be maintained by the tunnel effect.

The present invention enables the oxide film 6 to be formed on the surface of the TiN film 5 by a method of immersing the TiN film 5 in an oxidizing chemical such as nitric acid or the like. Namely, the silicon substrate 1 having the TiN film 5 formed thereon, as shown in FIG. 1, is immersed in a concentrated nitric acid solution heated at, for example, 60° C. for about 10 minutes, washed with water for 10 minutes and then dried in a constant temperature bath at 60° C. for 10 minutes. The aluminum film 7 is then deposited and patterned to form wiring, and the cover film 8 is then deposited in the same way as that shown in FIG. 4.

Although, in the above embodiment, the TiN film 5 is interposed as a barrier layer between the silicon substrate 1 and the aluminum film 7, when a surface oxide film is formed by the same method as that employed in the above embodiment using a titanium-tungsten alloy or platinum or nickel silicide for forming a barrier layer in place of the TiN film 5, the same effects can be obtained.

What is claimed is:

1. A method of producing a semiconductor device comprising the steps of:
    forming, on a surface of a semiconductor substrate, a barrier layer of at least one metal;
    forming an oxide film having a thickness which produces the tunnel effect on the surface of said barrier layer by heating said barrier layer in an atmosphere at about atmospheric pressure and having an oxygen concentration of 20±5% and a nitrogen concentration of 80±5%; and
    depositing a conductive layer selected from a group consisting of aluminum, aluminum alloys, tungsten, gold and copper on said barrier layer having said oxide film formed thereon.

2. A method of producing a semiconductor device comprising the steps of:
    forming, on a surface of a semiconductor substrate, a barrier layer of at least one metal;
    forming an oxide film having a thickness which produces the tunnel effect on the surface of said barrier layer by immersing said barrier layer in an oxidizing chemical; and
    depositing a conductive layer selected from a group consisting of aluminum, aluminum alloys, tungsten, gold and copper on said barrier layer having said oxide film formed thereon.

3. A method of producing a semiconductor device according to claim 1 wherein said barrier layer comprises a high-melting point metal nitride film.

4. A method of producing a semiconductor device according to claim 1 wherein said barrier layer comprises a metal silicide film.

5. A method of producing a semiconductor device according to claim 2, wherein said barrier layer comprises a high-melting point metal nitride film.

6. A method of producing a semiconductor device according to claim 2, wherein said barrier layer comprises a metal silicide film.

7. A method of producing a semiconductor device according to claim 1, wherein said step of forming said oxide layer includes the substep of:
    heating said barrier layer to about 350° C.–450° C. in said atmosphere for about 15 to 60 minutes.

* * * * *

UNITED STATES PATENT AND TRADEMARK OFFICE
CERTIFICATE OF CORRECTION

PATENT NO. : 5,236,869
DATED : August 17, 1993
INVENTOR(S) : Hideo TAKAGI et al.

It is certified that error appears in the above-identified patent and that said Letters Patent is hereby corrected as shown below:

Title Page, Section [56], "U.S. PATENT DOCUMENTS", insert
--5,175,126   12/1992   Ho et al.   437/192X--; and
          Section [56], "OTHER PUBLICATIONS", change
"Techanical" to --Technical--.

Column 4, line 7, change "currentvoltage" to
--current-voltage--; and
          line 66, change "afterheat" to --after heat--.

Signed and Sealed this

Sixteenth Day of August, 1994

Attest:

BRUCE LEHMAN

*Attesting Officer*        *Commissioner of Patents and Trademarks*